US010331804B2

(12) United States Patent
Himmler et al.

(10) Patent No.: US 10,331,804 B2
(45) Date of Patent: Jun. 25, 2019

(54) APPARATUS AND METHOD FOR TESTING AN AUTOMATIC CONTROL DEVICE

(71) Applicant: dSPACE digital signal processing and control engineering GmbH, Paderborn (DE)

(72) Inventors: Andreas Himmler, Paderborn (DE); Matthias Klemm, Paderborn (DE)

(73) Assignee: DSPACE DIGITAL SIGNAL PROCESSING AND CONTROL ENGINEERING GMBH, Paderborn (DE)

(*) Notice: Subject to any disclaimer, the term of this patent is extended or adjusted under 35 U.S.C. 154(b) by 352 days.

(21) Appl. No.: 15/097,318

(22) Filed: Apr. 13, 2016

(65) Prior Publication Data

US 2016/0306900 A1 Oct. 20, 2016

(30) Foreign Application Priority Data

Apr. 17, 2015 (DE) .................... 10 2015 207 054

(51) Int. Cl.
*G06F 17/50* (2006.01)
*G05B 11/01* (2006.01)
(Continued)

(52) U.S. Cl.
CPC .............. *G06F 17/50* (2013.01); *G05B 11/01* (2013.01); *G05B 15/02* (2013.01); *G05B 17/02* (2013.01)

(58) Field of Classification Search
CPC ......... G06F 17/50; G05B 11/01; G05B 15/02; G05B 17/02; G05B 19/41885;
(Continued)

(56) References Cited

U.S. PATENT DOCUMENTS

| 7,729,413 B2* | 6/2010 | Kohli ..................... G01C 21/26 |
| | | 375/149 |
| 2006/0064670 A1* | 3/2006 | Linebarger ................ G06F 8/34 |
| | | 717/106 |

(Continued)

FOREIGN PATENT DOCUMENTS

| CN | 101267251 A | 9/2008 |
| CN | 101384024 A | 3/2009 |

(Continued)

OTHER PUBLICATIONS dSPACE, "Catalog 2015", Jan. 2015, pp. 1-596.
(Continued)

*Primary Examiner* — Shahed Ahmed
(74) *Attorney, Agent, or Firm* — Leydig, Voit & Mayer, Ltd.

(57) ABSTRACT

A system for testing at least a first automatic control device via a plant model includes: a first subsystem; and a second subsystem which is spatially separated from the first subsystem. The plant model comprises an executable first model code and an executable second model code. The first subsystem comprises a first time-signal processing component configured to electronically assign a first time signal (Ts1) from a global time source to a first event. The first model code is configured to provide a first calculation result based on the first event. The second subsystem comprises a second time-signal processing component configured to electronically assign a second time signal (Ts2) from the global time source to a second event. The second model code is configured to provide a second calculation result based on the second event.

15 Claims, 1 Drawing Sheet

(51) Int. Cl.
*G05B 15/02* (2006.01)
*G05B 17/02* (2006.01)

(58) Field of Classification Search
CPC ........ G05B 2219/32359; G01R 31/008; G01S 5/04; G06T 2207/30164; G06T 2207/20021
USPC .......... 702/31, 32, 69, 79, 108, 115
See application file for complete search history.

(56) References Cited

U.S. PATENT DOCUMENTS

| | | | |
|---|---|---|---|
| 2006/0143547 A1 | 6/2006 | Haaks et al. | |
| 2008/0112439 A1* | 5/2008 | Vestal | H04J 3/0661 370/516 |
| 2010/0174522 A1 | 7/2010 | Stuenkel et al. | |
| 2010/0193245 A1* | 8/2010 | Glomsrud | E21B 44/00 175/45 |
| 2013/0282916 A1* | 10/2013 | Carter | H04L 65/60 709/231 |
| 2014/0214393 A1 | 7/2014 | Kim et al. | |
| 2014/0330405 A1* | 11/2014 | Franzen | G06F 17/5009 700/83 |
| 2015/0172727 A1* | 6/2015 | Annamraju | H04N 19/172 375/240.25 |
| 2015/0192658 A1* | 7/2015 | Ullah | G01S 5/04 455/456.1 |

FOREIGN PATENT DOCUMENTS

| | | |
|---|---|---|
| DE | 10326427 A1 | 12/2004 |
| DE | 102004022558 A1 | 12/2005 |
| DE | 102007029137 A1 | 1/2009 |
| DE | 102010018422 A1 | 10/2011 |

OTHER PUBLICATIONS

Himmler, et al., "Hardware-in-the-Loop Technology Enabling Flexible Testing Processes", 51$^{st}$ AIAA Aerospace Sciences Meeting, Dec. 2013, pp. 1-8.

Gehring, et al., "A Hardware-In-the-Loop Test Bench for the Validation of Complex ECU Networks", SAE Technical Paper, Mar. 4, 2002.

* cited by examiner

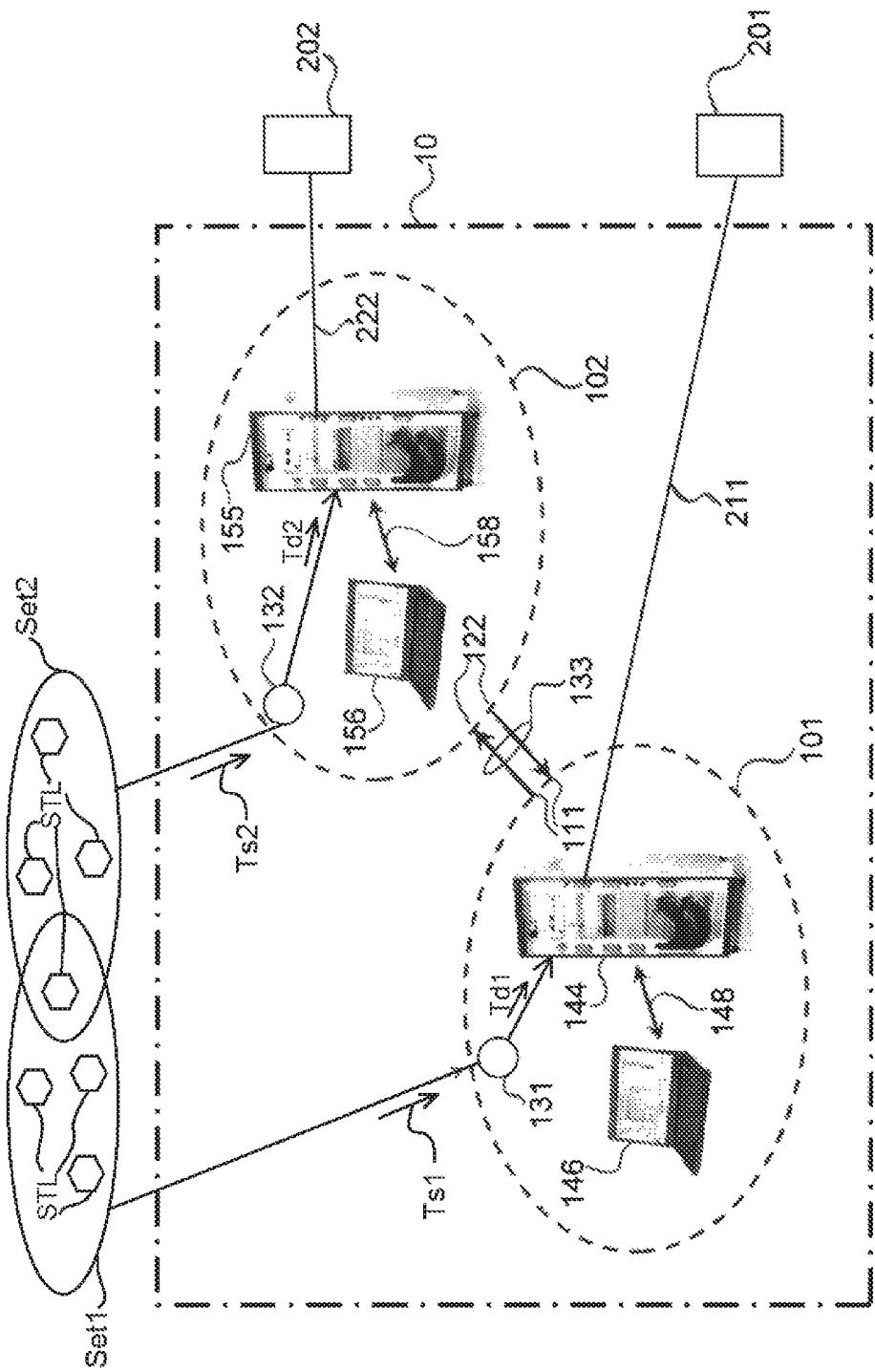

APPARATUS AND METHOD FOR TESTING AN AUTOMATIC CONTROL DEVICE

CROSS-REFERENCE TO RELATED APPLICATIONS

Priority is claimed to German Patent Application No. DE 102015207054.9, filed on Apr. 17, 2015, the entire disclosure of which is hereby incorporated by reference herein.

FIELD

The invention relates to an apparatus and to a method for testing at least a first electronic automatic control device using a plant model ("plant model" as understood in the context of control engineering). Such apparatuses frequently comprise at least a first computer unit and a second computer unit which is spatially separated from the first computer unit, the first computer unit having a first executable model code for calculating a first submodel of the plant model, and the second computer unit comprising a second executable model code for calculating a second submodel of the plant model.

BACKGROUND

Apparatuses for testing automatic control devices are known from a published product catalogue, "Catalog 2015/Embedded Success dSPACE", which is available as a printed catalogue, is cited hereinafter quoting the reference number "P1", and can be found on the internet at www.dspace.com/de/gmb/home/medien/product_info/catalog-_contents.cfm. In particular, apparatuses and the components thereof are described on pages 296 to 331 and on pages 496 to 515 of P1 for the specified use. The cross-linking of the apparatuses can be carried out for example via Ethernet interface cards, such as in the above-mentioned product catalogue on pages 472 and 473. Such apparatuses can be configured as "HIL simulators", the abbreviation "HIL" (hardware in the loop) referring to a closed control loop.

The automatic control devices mentioned at the outset are often referred to as control units, although the range of functions thereof generally goes beyond the "pure" open-loop control function in systems theory terms, and includes closed-loop control functions.

The first computer unit of the apparatus for testing, which comprises at least a first microprocessor, is provided and configured to execute a first model code which produces at least part of the plant simulation via the first microprocessor ("plant" as understood in the context of control engineering). Together with the hardware of the apparatus, the model code reproduces the technical environment of an electronic device or of a more complex technical system at least in part. Using the model code, the apparatus provides simulated sensor signals for the automatic control device, for example. Furthermore, the apparatus can be used, for example, as a controlled current sink for diverting an actuator current provided by the automatic control device.

HIL simulation is an international term, which is also used in particular in German-speaking countries, for a test method in which an "embedded system", for example an automatic control device or a mechatronic module is connected via the inputs and outputs thereof to an adapted counterpart, for example an apparatus in the form of an HIL simulator, which apparatus is used to reproduce the actual environment of the embedded system. During testing of the embedded system, at least some of the input signals for the embedded system are thus provided by the HIL simulator, and at least some of the output signals of the embedded system are sent to the HIL simulator.

For example, using a model code of a plant model, which is executed on a single HIL simulator, the temporal behaviour of the environment of the system to be tested is reproduced. If for example an HIL simulator is intended to test an embedded system, in particular an automatic control device (often referred to as an ECU: "electronic automatic control device", for short), then the HIL simulator is configured as an at least partial reproduction of the actual environment of the automatic control device. In this case, the HIL simulator can thus communicate with the control device via the inputs and outputs or bidirectional communication channels thereof and thus function as an adapted counterpart to the automatic control device.

The HIL simulation usually has to take place in real time. When simulating the technically relevant environment of the automatic control device, the simulated environment comprising the simulated plant ("plant" as understood in the context of control engineering), in particular such interactions of the automatic control device, which can recur in a later actual environment of the automatic control device, can be reproduced in an automated manner and/or in a predefined sequence. This has the advantage that a new development version of open-loop or closed-loop control software can be tested according to the same criteria as the previous version. Thus it can be demonstrated in detail whether an error has been resolved or not (retesting).

Tests on actual systems (for example on a braking system or an anti-slip system of a motor vehicle) can be greatly reduced through the tests on the HIL simulator and, in addition, system limits or limits on the controllability of the automatic control device and/or the plant can be determined without the actual system and the users thereof (e.g. cars and drivers) being placed at risk.

The HIL simulation is still only a simplification of reality and usually cannot completely replace the subsequent test on the actual system which usually follows, for example the test of the interaction of the automatic control device with the "real" plant of a controlled prototype and/or the test of the interaction of the automatic control device with a controlled standard product.

It is known to use a spatially distributed apparatus to test at least one electronic automatic control device, the apparatus comprising at least two separate computer units—for example at least two simulators which are at a distance from one another and are cross-linked. In the document "A Hardware-in-the-Loop Test Bench for the Validation of Complex ECU Networks", J. Gehring, H. Schütte, dSPACE GmbH, page 3, FIG. 3 of the 2002 document, publication reference "SAE 2002 Word Congress Detroit, Michigan Mar. 4-7, 2002", which was published in 2002 and is referred to below as P2, an apparatus is shown which is configured as a distributed HIL simulator and comprises a plurality of computer units which in this case are configured for example as a central unit, an engine, a transmission and a combined ESP suspension. The computer units are cross-linked to one another via an optical connection, i.e. a high-speed optical link. On the right-hand side of page 7, paragraph "Conclusion" in the second bullet point of said document, it is mentioned that requirements for an interprocessor communication may necessitate time stamping and automatic process synchronisation.

From the document "Hardware-in-the-Loop Technology Enabling Flexible Testing Processes", Andreas Himmler, dSPACE GmbH, page 3, paragraph B., publication reference "51st AIAA Aerospace Sciences Meeting, 2013, Grapevine, Tex., USA", which is referred to in the following as P3, it is known to provide a serial network called IOCNET, which builds on the physical layer of the Gigabit Ethernet, for HIL simulators, through which the interface cards provided for the input and output of signals and data, abbreviated to I/O cards, can exchange data both with one another and with the microprocessor card(s) in real time. For the exchange of data between the I/O cards and/or processor cards which are for example up to 100 meters apart, Gigalink modules can be used, as are shown for example in the above-mentioned document P1 on pages 355 and 361. As data transmission media between the I/O cards and/or processor card(s) which are for example 100 meters apart, a fibre-optic cable connection, referred to here as "optical media" or "fibre-optic cable", is proposed in P3, page 3, paragraph B and in P1, page 349. The already mentioned network IOCNET provides a protocol which supports a time synchronisation, in particular for reading input signals at the interfaces of the I/O cards used; see optionally document P1, page 299 together with the drawing on the same page in this regard.

The above-mentioned cross-linking solutions using IOCNET for time synchronisation within an apparatus—in particular an HIL simulator—in order to test an automatic control device is in any case only provided for a distance between the computer units which exceeds 100 meters by only a negligible amount.

SUMMARY

In an embodiment, the invention provides a system for testing at least a first automatic control device via a plant model, wherein the system comprises: a first subsystem; and a second subsystem which is spatially separated from the first subsystem. The plant model comprises an executable first model code and an executable second model code. The first model code is stored on the first subsystem and is configured to be executed by a processor of the first subsystem. The second model code is stored on the second subsystem and is configured to be executed by a processor of the second subsystem. The first subsystem comprises a first time-signal processing component configured to electronically assign a first time signal (Ts1) from a global time source to a first event. The first model code is configured to provide a first calculation result based on the first event. The second subsystem comprises a second time-signal processing component configured to electronically assign a second time signal (Ts2) from the global time source to a second event. The second model code is configured to provide a second calculation result based on the second event. The first time-signal processing component is configured to convert the first time signal (Ts1) into a first modified time signal (Td1), wherein the first modified time signal (Td1) includes a first periodic signal and a first time message. The second time-signal processing component is configured to convert the second time signal (Ts2) into a second modified time signal (Td2), wherein the second modified time signal (Td2) includes a second periodic signal and a second time message. The first subsystem is configured to link the first calculation result to a first item of time information which comes from the first modified time signal (Td1). The second subsystem is configured to link the second calculation result to a second item of time information which comes from the second modified time signal (Td2).

BRIEF DESCRIPTION OF THE DRAWINGS

The present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

The drawing in FIG. 1 is a schematic view of a first embodiment of an apparatus 10 according to the invention for testing a first automatic control device 201 via a plant model.

DETAILED DESCRIPTION

The development of automatic control devices and the control software implemented therein increasingly takes place in spatially distributed work groups. In this case, a plurality of companies in various locations are often involved. In order to test the automatic control devices in the progressing development phases, the software and hardware developers involved therefore require frequently adapted apparatuses, in particular apparatuses which can be adapted in situ, for testing.

There may thus be a need for an apparatus for testing which comprises, for example, a network composed of two or more computer units—for example HIL simulators, said computer units or HIL simulators being located in different locations and it being possible for the locations to be considerably more than 100 meters apart.

In practice, automatic control devices are very often cross-linked with additional automatic control devices. For example, motor vehicles comprising more than 40 automatic control devices are not uncommon, it being possible, depending on the application, for some of the automatic control devices to only ensure the associated range of functions in each case when they are cross-linked, which is immediately clear in the case of the example of the cross-linking of an automatic transmission automatic control device with an engine automatic control device.

Should there be a requirement to connect automatic control devices in various locations to a distributed apparatus for testing, in particular to an apparatus which includes a plurality of HIL simulator devices, which are for example several hundred meters or several kilometers apart, and could optionally even be located on different continents, then previous solutions of cross-linking and synchronising the computer units of the distributed apparatus would fail in some circumstances, depending on the distance between the computer units of the apparatus, or, when using the previous solutions of cross-linking and synchronising, huge disadvantages would have to be tolerated, in particular with respect to the precision of the temporal assignment of interactions between the automatic control devices and the apparatus thereof for testing.

In view of the above, embodiments of the invention provide an apparatus for testing at least a first automatic control device via a plant model, wherein the apparatus (10) comprises at least a first computer unit (101) and a second computer unit (102) which is spatially separated from the first computer unit (101), wherein the plant model includes at least one executable first model code and one executable second model code, and the first model code is stored on the first computer unit (101) and is provided for execution, and the second model code is stored on the second computer unit (102) and is provided for execution, and the first computer unit (101) comprises a first time-signal processing component (131) which is configured to electronically assign a first time signal (Ts1) from a global time source (Set1, Set2) to a first event, and provision of a first calculation result by the first model code can be influenced by the first event, and the second computer unit (102) comprises a second time-signal processing component (132) which is configured to electronically assign a second time signal (Ts2) from the global time source (Set1, Set2) to a second event, and provision of a second calculation result by the second model code can be influenced by the second event, and wherein the first time signal (Ts1) can be converted into a first modified time signal (Td1) by the first time-signal processing component (131), wherein the first modified time signal (Td1) includes a first periodic signal and a first time message, and the second time signal (Ts2) can be converted into a second modified time signal (Td2) by the second time-signal processing component (132), wherein the second modified time signal (Td2) includes a second periodic signal and a second time message, and wherein the first computer unit (101) is configured to link the first calculation result to a first item of time information which comes from the first modified time signal (Td1), and wherein the second computer unit (102) is configured to link the second calculation result to a second item of time information which comes from the second modified time signal (Td2).

In addition, embodiments of the invention provide a method for testing at least a first automatic control device via a plant model, wherein the method is carried out by an apparatus (10) which comprises at least a first computer unit (101) and a second computer unit (102) which is spatially separated from the first computer unit (101), wherein the plant model includes at least one executable first model code and one executable second model code, and the first model code is stored and executed on the first computer unit (101), and the second model code is stored and executed on the second computer unit (102), and wherein the first computer unit (101) comprises a first time-signal processing component (131) which electronically assigns a first time signal (Ts1) from a global time source (Set1, Set2) to a first event, and based on the first event, a first calculation result is provided by the first model code, and the second computer unit (102) comprises a second time-signal processing component (132) which electronically assigns a second time signal (Ts2) from the global time source (Set1, Set2) to a second event, and based on the second event, a second calculation result is provided by the second model code, and wherein the first time signal (Ts1) is converted into a first modified time signal (Td1) by the first time-signal processing component (131), wherein the first modified time signal (Td1) includes a first periodic signal and a first time message, and the second time signal (Ts2) is converted into a second modified time signal (Td2) by the second time-signal processing component (132), wherein the second modified time signal (Td2) includes a second periodic signal and a second time message, and wherein the first computer unit (101) links the first calculation result to a first item of time information which comes from the first modified time signal (Td1), and the second computer unit (102) links the second calculation result to a second item of time information which comes from the second modified time signal (Td2).

One of the advantages of the apparatus according to the invention and of the method according to the invention is that the first computer unit and the second computer unit can be synchronised in a comparatively simple manner thereby, despite a distance of potentially a few hundred meters or even several kilometers between the computer units.

Insofar as the term "synchronisation" is used in the context of this document, temporal synchronisation is always meant thereby. Synchronisation known as angle synchronisation is often based on temporal synchronisation. In any case, the present invention does not relate to angle synchronisation.

The invention will be described in greater detail below with reference to the drawings. In this case, like parts will be inscribed with the same reference signs. The embodiments shown are highly schematic.

The drawing in FIG. 1 is a schematic view of a first embodiment of an apparatus 10 according to the invention for testing a first automatic control device 201 via a plant model.

Preferably, through the first network interface 111 and the second network interface 122, the first calculation result can be transmitted to the second computer unit via a network connection 133.

The network connection 133 is for example in the form of an Ethernet connection.

In a preferred embodiment of the apparatus according to the invention, at an identical point in time during a simulation running on the apparatus, the first modified time signal Td1 and the second modified time signal Td2 represent a second item of time information which is substantially identical to the first item of time information.

According to another embodiment of the apparatus according to the invention, the first periodic signal and the second periodic signal have an identical frequency.

In further embodiments of the apparatus, it is provided that the frequencies of the first periodic signal and the second periodic signal are at least ten times higher than an update frequency of the first time message and/or the second time message.

In another embodiment of the apparatus according to the invention, the first calculation result and the first item of time information which is linked thereto, and the second calculation result and the second item of time information which is linked thereto are provided to be further processed on the second computer unit 102 via the second model code.

According to another embodiment of the apparatus, the second computer unit (102) is configured to process the first calculation result and the second calculation result together when the first item of time information which is linked to the first calculation result and the second item of time information which is linked to the second calculation result are substantially identical.

In one embodiment of the apparatus according to the invention, the second computer unit 102 is configured to process the first calculation result and the second calculation result together when the first item of time information which is linked to the first calculation result and the second item of time information which is linked to the second calculation result are not identical, but a value of a difference between the first item of time information and the second item of time information lies in a predefined permissible range.

In this case, it can optionally be provided that the predefined permissible value range is determined on the basis of a property which is directly linked to the first calculation result and/or to the second calculation result and describes a component of the plant.

In a preferred embodiment of the apparatus according to the invention, the global time source Set1, Set2 is a time signal source of a global navigation satellite system.

In this case, it is preferable for the global navigation satellite system to correspond to the global positioning system (GPS) or the GLONASS or the GALILEO or the BEIDOU or the GAGAN or the IRNSS or the QZSS navigation satellite system.

The global time source preferably includes a plurality of quantities Set1, Set2 of satellites STL.

Furthermore, it is preferable for a first computer clock of the first computer unit 101 and a second computer clock of the second computer unit 102 to be synchronised via the first modified time signal Td1 and the second modified time signal Td2.

In one embodiment of the apparatus according to the invention, a first start time and/or a first termination time of an execution of a first software module of the first model code, and a second start time and/or a second termination time of an execution of a second software module of the second model code are preset based on the first modified time signal Td1.

In another embodiment of the apparatus, the first computer unit 101 comprises a first simulator 144 and a first operator computer 146, and the second computer unit 102 comprises a second simulator 155 and a second operator computer 156, the first time-signal processing component 131 being connected to the first simulator 144 and/or to the first operator computer 146, and the second time-signal processing component 132 being connected to the second simulator 155 and/or to the second operator computer 156.

In another embodiment of the apparatus according to the invention, the first computer unit 101 and the second computer unit 102 are connected via the network connection 133, the network connection 133 being provided and configured to transmit the first calculation result to the second computer unit via the network connection 133 and/or to transmit the second calculation result to the first computer unit 101 via the network connection 133.

It is preferable for the first computer unit 101 to be connected to the first automatic control device 201 via a first communication channel 211, and for the second computer unit 102 to be connected to the second automatic control device 202 via a second communication channel 222, and for a signal provided by the first automatic control device 201 and/or by the second automatic control device 202 to be linkable to the first item of time information or to the second item of time information.

In another preferred embodiment of the apparatus, the second model code is provided and configured to use a predefined replacement value instead of the first calculation result to determine a third calculation result if transmission of the first calculation result from the first network interface 111 to the second network interface 122 is not carried out within a predefined maximum time starting from when the first calculation result is provided for the first time.

In another embodiment of the apparatus according to the invention, the first computer unit 101 and the second computer unit 102 are at a distance of more than 200 meters from one another.

According to a preferred embodiment of the apparatus according to the invention, the first computer unit 101 comprises a first simulator 144 and a first operator computer 146, and the second computer unit 102 comprises a second simulator 155 and a second operator computer 156, the first time-signal processing component 131 being connected to the first simulator 144 and/or to the first operator computer 146, and the second time-signal processing component 132 being connected to the second simulator 155 and/or to the second operator computer 156.

An exchange of data between the first operator computer 146 and the first simulator takes place for example via a first user interface 148 which is shown as a double arrow. An exchange of data between the second operator computer 156 and the second simulator takes place for example via a second user interface 158 which is shown as a double arrow.

In another embodiment of the apparatus, the first computer unit 101 and the second computer unit 102 are connected via the network connection 133, the network connection 133 being provided and configured to transmit the first calculation result to the second computer unit via the network connection 133 and/or to transmit the second calculation result to the first computer unit 101 via the network connection 133.

In another embodiment of the apparatus, through a first communication channel 211, the first computer unit 101 is connected to the first automatic control device 201, and through a second communication channel 222, the second computer unit 102 is connected to the second automatic control device 202.

According to the invention, a method for testing at least a first automatic control device 201 via a plant model is provided, wherein the method is carried out through an apparatus 10 which comprises at least a first computer unit 101 and a second computer unit 102 which is spatially separated from the first computer unit 101, wherein the plant model includes at least one executable first model code and one executable second model code, and the first model code is stored and executed on the first computer unit 101, and the second model code is stored and executed on the second computer unit 102, and wherein the first computer unit 101 comprises a first time-signal processing component 131 which electronically assigns a first time signal Ts1 from a global time source Set1, Set2 to a first event, and based on the first event, a first calculation result is provided by the first model code, and the second computer unit 102 comprises a second time-signal processing component 132 which electronically assigns a second time signal Ts2 from the global time source Set1, Set2 to a second event, and based on the second event, a second calculation result is provided by the second model code, and wherein the first time signal Ts1 is converted into a first modified time signal Td1 by the first time-signal processing component 131, wherein the first modified time signal Td1 includes a first periodic signal and a first time message, and the second time signal Ts2 is converted into a second modified time signal Td2 by the second time-signal processing component 132, wherein the second modified time signal Td2 includes a second periodic signal and a second time message, and wherein the first computer unit 101 links the first calculation result to a first item of time information which comes from the first modified time signal Td1, and the second computer unit 102 links the second calculation result to a second item of time information which comes from the second modified time signal Td2.

In one embodiment of the method according to the invention, the global time source Set1, Set2 is a time signal source of a "global navigation satellite system", abbreviated to "GNSS".

Some of the different global navigation satellite systems of the individual countries, or groups of countries, or regionally or internationally cooperating companies have already been listed in the description of the embodiments of the apparatus according to the invention.

According to another embodiment of the method according to the invention, a first computer clock of the first computer unit 101 and a second computer clock of the second computer unit 102 are synchronised via the first time specification.

In one embodiment of the method, based on the second model code, a predefined replacement value is used instead of the first calculation result to determine a third calculation result if transmission of the first calculation result from the first network interface 111 to the second network interface 122 does not take place within a predefined maximum time starting from when the first calculation result is provided for the first time.

According to another embodiment of the method according to the invention, the first computer unit 101 is connected to the first automatic control device 201 via a first communication channel 211, and the second computer unit 102 is connected to the second automatic control device 202 via a second communication channel 222, and a signal provided by the first automatic control device 201 and/or by the second automatic control device 202 is linked to the first time specification of the global time source Set1, Set2.

It should be noted that cross-linking the automatic control devices does not necessarily have to be established via a direct data connection between the automatic control devices in all test scenarios. It is possible to avoid a "direct" connection of the automatic control devices to be cross-linked for example in order to implement selected test scenarios in such a way that, through the test apparatus, the interfaces of the automatic control devices are subjected to for example electric potentials, signals and/or additional environmental conditions, this representing as realistic a reproduction as possible of the environment which will subsequently actually be present for the automatic control devices. Thus in predefined use or test scenarios, it is sufficient for a test apparatus which is distributed over various locations, i.e. for example a distributed HIL simulator, to act on the interfaces of the optionally likewise distributed automatic control devices, i.e. for example to provide the signal sources and/or the signal sinks and/or the current sources and/or the current sinks of the automatic control devices.

It should additionally be mentioned that the known global navigation satellite systems are primarily used for position determination and navigation on the ground and in the air, but the time signals from the global navigation satellite systems can be used for additional applications, as set out in the present document.

The best-known global navigation satellite systems include:
 GPS, i.e. the "Global Positioning System" of the United States of America;
 GLONASS, i.e. the "GLObal NAvigation Satellite System" of the Russian Federation;
 Galileo of the European Union, and
 Beidou of the People's Republic of China.

The full expansion of Beidou and Galileo is expected in the next few years.

What is known as GPS time comes from the time system of the navigation satellites of the Global Positioning System. It corresponds—except for a slight deviation of a few seconds—to International Atomic Time, which is abbreviated to TAI. GPS time likewise deviates from the Coordinated Universal Time, referred to as UTC, by a few seconds.

In the context of the user data transmitted by GPS, transmission of the current difference between GPS time and UTC takes place in a specially dedicated data field. By subtracting the corresponding number of leap seconds, GPS receivers can automatically display or provide the UTC time. GPS receivers are thus suitable for use in a first and second time-signal processing components 131, 132, since said receivers make a globally available first time specification available to the first and second computer unit 101, 102 for further use.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A system for testing at least one automatic control device via a plant model, wherein the system comprises:
 a first computer subsystem connected to a first automatic control device, wherein a first model code which provides a first part of a plant simulation corresponding to the plant model is stored on the first computer subsystem, and wherein a processor of the first computer subsystem is configured to execute the first model code and to provide, based on the first model code, a first calculation result corresponding to a first event; and
 a second computer subsystem connected to a second automatic control device, wherein the second computer subsystem is spatially separated from the first computer subsystem, wherein a second model code which provides a second part of the plant simulation corresponding to the plant model is stored on the second computer subsystem, and wherein a processor of the second computer subsystem is configured to execute the second model code and to provide, based on the second model code, a second calculation result corresponding to a second event;
 wherein the first computer subsystem comprises a first time-signal processing component configured to receive a first time signal (Ts1) from a global time source, and to convert the first time signal (Ts1) into a first modified time signal (Td1), wherein the first modified time signal (Td1) includes a first periodic signal and a first time message;
 wherein the second computer subsystem comprises a second time-signal processing component configured to receive a second time signal (Ts2) from the global time source, and to convert the second time signal (Ts2) into a second modified time signal (Td2), wherein the second modified time signal (Td2) includes a second periodic signal and a second time message;

wherein the second computer subsystem is configured to synchronize the second part of the plant simulation with the first part of the plant simulation based on the first and second time signals (Ts1, Ts2) and the first and second modified time signals (Td1, Td2), wherein synchronizing the second part of the plant simulation with the first part of the plant simulation includes assigning the first and second time signals (Ts1, Ts2) to the first and second events, respectively, and linking first and second items of time information which come from the first and second modified time signals (Td1, Td2) to the first and second calculation results corresponding to the first and second events, respectively.

2. The system according to claim 1, wherein, at an identical point in time during the plant simulation, the second modified time signal (Td2) represent a second item of time information which is substantially identical to the first item of time information represented by the first modified time signal (Td1).

3. The system according to claim 1, wherein the first periodic signal and the second periodic signal have an identical frequency.

4. The system according to claim 1, wherein a frequency of the first periodic signal is at least ten times higher than an update frequency of the first time message; and/or
wherein a frequency of the second periodic signal is at least ten times higher than an update frequency of the second time message.

5. The system according to claim 1, wherein the second computer subsystem, based on the second model code, is configured to receive the first calculation result and the first item of time information from the first computer subsystem.

6. The system according to claim 1, wherein the second computer subsystem is configured to process the first calculation result and the second calculation result together when the first item of time information which is linked to the first calculation result and the second item of time information which is linked to the second calculation result are substantially identical.

7. The system according to claim 1, wherein the second computer subsystem is configured to process the first calculation result and the second calculation result together when the first item of time information which is linked to the first calculation result and the second item of time information which is linked to the second calculation result are not identical, but a value of a difference between the first item of time information and the second item of time information lies in a predefined permissible range.

8. The system according to claim 7, wherein the predefined permissible value range is determined based on a property which is directly linked to the first calculation result and/or to the second calculation result and describes a component of the plant.

9. The system according to claim 1, wherein the global time source is a time signal source of a global navigation satellite system.

10. The system according to claim 1, wherein a first computer clock of the first computer subsystem and a second computer clock of the second computer subsystem are synchronized based on the first modified time signal (Td1) and the second modified time signal (Td2).

11. The system according to claim 1, wherein a first start time and/or a first termination time for execution of a first software module of the first model code and a second start time and/or a second termination time for execution of a second software module of the second model code are preset based on the first modified time signal (Td1).

12. The system according to claim 1, wherein the first computer subsystem comprises a first simulator and a first operator computer, and the second computer subsystem comprises a second simulator and a second operator computer, the first time-signal processing component being connected to the first simulator and/or to the first operator computer, and the second time-signal processing component being connected to the second simulator and/or to the second operator computer.

13. The system according to claim 1, wherein the first computer subsystem and the second computer subsystem are connected via a network connection, the network connection being configured for transmission of the first calculation result to the second subsystem via the network connection and/or for transmission of the second calculation result to the first subsystem via the network connection.

14. The system according to claim 1, wherein the first computer subsystem is connected to the first automatic control device via a first communication channel, and the second computer subsystem is connected to the second automatic control device via a second communication channel;
wherein a signal provided by the first automatic control device and/or by the second automatic control device is linkable to the first item of time information or to the second item of time information.

15. A method for testing at least one automatic control device via a plant model, wherein the method is carried out via a system comprising a first computer subsystem connected to a first automatic control device and a second computer subsystem connected to a second automatic control device, wherein the second computer subsystem is spatially separated from the first computer subsystem, wherein the method comprises:
executing a first model code which provides a first part of a plant simulation corresponding to the plant model on the first computer subsystem and providing, based on the first model code, a first calculation result corresponding to a first event; and
executing a second model code which provides a first part of the plant simulation corresponding to the plant model on the second computer subsystem and providing, based on the second model code, a second calculation result corresponding to a second event;
receiving, by the first computer subsystem, a first time signal (Ts1) from a global time source, and converting the first time signal (Ts1) into a first modified time signal (Td1), wherein the first modified time signal (Td1) includes a first periodic signal and a first time message;
receiving, by the second computer subsystem, a second time signal (Ts2) from the global time source, and converting the second time signal (Ts2) into a second modified time signal (Td2), wherein the second modified time signal (Td2) includes a second periodic signal and a second time message;
synchronizing, by the second computer subsystem, the second part of the plant simulation with the first part of the plant simulation based on the first and second time signals (Ts1, Ts2) and the first and second modified time signals (Td1, Td2), wherein synchronizing the second part of the plant simulation with the first part of the plant simulation includes assigning the first and second time signals (Ts1, Ts2) to the first and second events, respectively, and linking first and second items of time information which come from the first and second modified time signals (Td1, Td2) to the first and second calculation results corresponding to the first and second events, respectively.

\* \* \* \* \*